United States Patent [19]

Suzuki

[11] 4,385,243
[45] May 24, 1983

[54] AUTOMATIC RESET CIRCUIT

[75] Inventor: Osamu Suzuki, Tokyo, Japan

[73] Assignee: Fujitsu Limited, Kawasaki, Japan

[21] Appl. No.: 150,793

[22] Filed: May 19, 1980

[30] Foreign Application Priority Data

May 23, 1979 [JP] Japan ................................. 54-63714

[51] Int. Cl.³ ..................... H03K 17/22; H03K 5/153
[52] U.S. Cl. .................................. 307/350; 307/252 J; 307/296 R; 307/363; 307/597
[58] Field of Search .......... 307/296 R, 252 A, 252 D, 307/252 J, 350, 363, 592, 597, 598

[56] References Cited

U.S. PATENT DOCUMENTS

| | | | |
|---|---|---|---|
| 3,679,912 | 7/1972 | Tenenbaum | 307/363 |
| 3,895,239 | 7/1975 | Alaspa | 307/296 R |
| 4,013,902 | 3/1977 | Payne | 307/363 |
| 4,194,134 | 3/1980 | Bjorklund et al. | 307/363 |
| 4,232,236 | 11/1980 | Yomogida et al. | 307/296 R |

*Primary Examiner*—John Zazworsky
*Attorney, Agent, or Firm*—Staas & Halsey

[57] ABSTRACT

An automatic reset circuit located on an integrated circuit chip, for providing automatically a reset signal to circuit elements which are required to be reset when a power supply is turned on. The reset circuit comprises a reset signal output means for providing a reset signal, a level detecting means for detecting that the electric potential of the power supply has reached a predetermined level, and a latching means for cutting off the reset signal according to the detecting output of the level detecting means. Once the latching means cuts off the reset signal, the latching means holds it so until the power supply voltage falls down to a certain level lower than the predetermined level.

12 Claims, 7 Drawing Figures

AUTOMATIC RESET CIRCUIT

BACKGROUND OF THE INVENTION

This invention relates to an automatic reset circuit for providing a reset signal to one or more circuit elements, such as flip-flops, which are required to be reset when a power supply connected to these circuit elements is turned on.

In the field of digital circuitry, various flip-flops are used as circuit elements of a counter or a shift register. As well known in the art, a flip-flop has two stable states. For example, in an R-S flip-flop, a high level signal (H) is outputted when a set signal is received at its set input and a low level signal (L) is outputted when a reset signal is received at its reset input. A counter including such flip-flops performs counting by calculating the number of, for example, the high level signals during a desired period. In order to count correctly, the flip-flops must be set to their initial state or, in other words, must be reset at the beginning of the counting by a reset signal at the reset inputs of the flip-flops, unless the flip-flops are preset by other means. A pin on an integrated circuit may be used as a reset terminal for receiving the reset signal. However, in order to increase the integration degree of an integrated circuit, pins are used primarily as terminals connected to a power supply or signal lines, and it is desired not to use the pins for other terminals, such as the reset terminal for receiving the reset signal. In order not to use a pin for a reset terminal, it is necessary to assemble an output circuit for providing the reset signal in an integrated circuit whereby the reset signal is outputted automatically when the electric potential of a power supply rises at the time of turning on the power supply.

SUMMARY OF THE INVENTION

Accordingly, a principal object of the present invention is to provide an automatic reset circuit assembled in an integrated circuit without increasing the number of pins.

Another object of the invention is to provide such an automatic reset circuit in which the reset signal is outputted automatically before the power supply voltage reaches the normal operating voltage of the circuit elements required to be reset.

Still another object of the invention is to provide such an automatic reset circuit in which, once the power supply voltage reaches the normal operating voltage, the reset signal is not outputted even when the power supply voltage fluctuates.

These and other objects and advantages of the present invention may best be understood by reference to the following detailed description of illustrative embodiments, when read in conjunction with the accompanying drawings.

DESCRIPTION OF THE PREFERRED EMBODIMENTS

Figure 1:
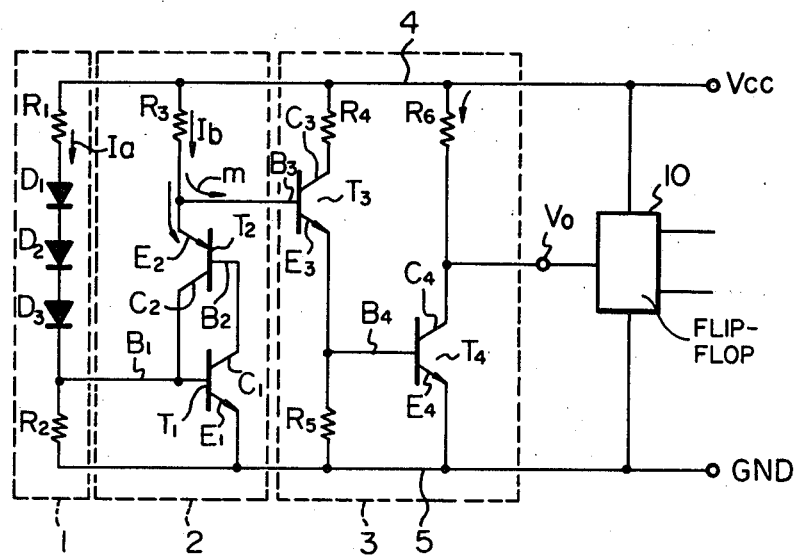
FIG. 1 is a circuit diagram of an automatic reset circuit, according to one embodiment of the present invention.

Referring to FIG. 1, an automatic reset circuit according to one embodiment of the invention is illustrated. In FIG. 1, the automatic reset circuit is comprised of a detecting circuit 1 for detecting the voltage of a power line connected to it, a latching circuit 2, and a reset signal output circuit 3.

The detecting circuit 1 is comprised of a first resistor $R_1$, first, second, and third diodes $D_1$, $D_2$, and $D_3$, and a second resistor $R_2$. The three diodes $D_1$, $D_2$, and $D_3$ are connected in series in a forward direction between one end of the first resistor $R_1$ and one end of the second resistor $R_2$. The other end of the first resistor $R_1$ is connected to a power line 4 which is connected to a power supply $V_{CC}$. The other end of the second resistor $R_2$ is connected to a ground line 5.

The latching circuit 2 is comprised of a P-N-P-N switching element. The P-N-P-N switching element is, as well known in the art, comprised of an NPN transistor $T_1$ and a PNP transistor $T_2$. The base $B_1$ of the transistor $T_1$ is connected to the collector $C_2$ of the transistor $T_2$. The base $B_2$ of the transistor $T_2$ is connected to the collector $C_1$ of the transistor $T_1$. The emitter $E_1$ of the transistor $T_1$, which is the cathode of the P-N-P-N switching element, is connected to the ground line 5. The base $B_1$ of the transistor $T_1$, which is the gate of the P-N-P-N switching element, is connected to a point between the third diode $D_3$ and the second resistor $R_2$. The emitter $E_2$ of the transistor $T_2$, which is the anode of the P-N-P-N switching element, is connected through a third resistor $R_3$ to the power line 4.

The reset signal output circuit 3 is comprised of a third NPN transistor $T_3$ and a fourth NPN transistor $T_4$. The collector $C_3$ of the third NPN transistor $T_3$ is connected through a fourth resistor $R_4$ to the power line 4. The base $B_3$ of the third transistor $T_3$ is connected to the emitter $E_2$ of the transistor $T_2$ or, in other words, to the anode of the P-N-P-N switching element. The emitter $E_3$ of the third transistor $T_3$ is connected through a fifth resistor $R_5$ to the ground line 5 and is connected directly to the base $B_4$ of the fourth transistor $T_4$. The collector $C_4$ of the fourth transistor $T_4$ is connected directly to an output terminal $V_O$ of this automatic reset circuit, and is connected through a sixth resistor $R_6$ to the power line 4. The emitter $E_4$ of the fourth transistor $T_4$ is connected to the ground line 5. The output terminal $V_O$ is connected to a reset input of a flip-flop 10, which also has a power input connected to the power line 4. The flip-flop 10 is required to be reset when the power supply $V_{CC}$ is turned on. The automatic reset circuit and the flip-flop 10 are integrated in a semiconductor chip. Usually, in an integrated-circuit chip, there are various circuit elements, such as flip-flops, which are required to be reset when the power supply is turned on. However, in this embodiment, only one flip-flop is shown in the chip, in order to avoid redundancy.

Figure 2:
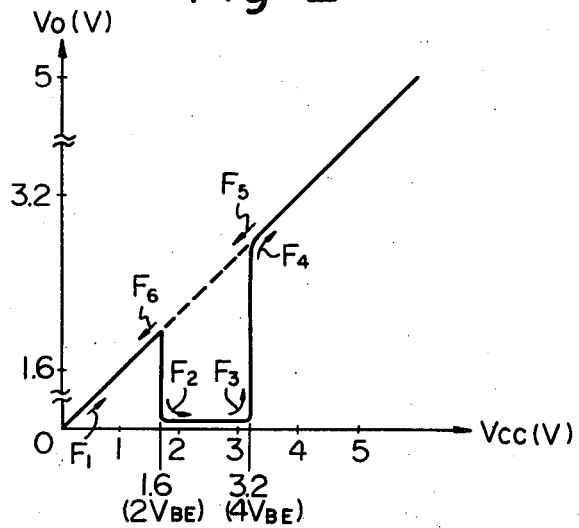
FIG. 2 is a graph diagram for explaining the operation of the circuit of FIG. 1.

The operation of the circuit of FIG. 1 will now be explained with reference to both FIGS. 1 and 2. In FIG. 2, the abscissa represents the voltage of the power supply $V_{CC}$ and the ordinate represents the voltage of the output terminal $V_O$. When the power supply $V_{CC}$ is turned on, the electric potential of the power line 4 rises from zero volts to a constant voltage of, for example, 5 V. When the electric potential is increased, the voltage of the output terminal $V_O$ is increased along with the increase of the voltage of the power line 4 until the power-line voltage reaches 2 $V_{BE}$, where $V_{BE}$ represents the forward base-emitter voltage of a transistor and is about 0.8 V. When the voltage of the power line 4 reaches the value 2 $V_{BE}$, the third transistor $T_3$ is turned on and then the fourth transistor $T_4$ is turned on, resulting in the voltage of the output terminal $V_O$ being dropped to a low level nearly equal to zero volts. Since the forward voltage drop across a diode is nearly $V_{BE}$ when a current is conducted through the diode, and there are three diodes $D_1$, $D_2$ and $D_3$ connected in series in the detecting circuit 1, a voltage of at least 3 $V_{BE}$ is required in theory at the power line 4 for conducting a current from the power line 4 through the first resistor $R_1$, the three diodes $D_1$, $D_2$, and $D_3$, and the second resistor $R_2$. The value of the first resistor $R_1$ is determined to be much smaller than that of the second resistor $R_2$, so that the voltage drop across the terminals of the resistor $R_1$ is nearly equal to zero. The value of the second resistor $R_2$ is determined to be much larger so that, when a small current is conducted through the resistor $R_2$, the voltage drop across the terminals of the resistor $R_2$ is slightly larger than $V_{BE}$. Therefore, in practice, in order to conduct a current through the detecting circuit 1, at least 4 $V_{BE}$ is required at the power line 4. When the voltage increase of the power line 4 is smaller than 4 $V_{BE}$, the detecting circuit 1 does not conduct any curent and, in this condition, the first transistor $T_1$ is in an off state, because it is supplied with no base current. Thus, no current is conducted through the third resistor $R_3$, the emitter $E_2$, and the base $B_2$ of the second transistor $T_2$; that is, the second transistor $T_2$ is also in an off state. Therefore, the voltage of the emitter $E_2$, which is the output of the latching circuit 2 and is connected to the base $B_3$ of the third transistor $T_3$, is maintained at a high level, so that the on state of the third and fourth transistors $T_3$ and $T_4$ is not changed unless the voltage of the power line 4 reaches 4 $V_{BE}$.

When the voltage of the power line 4 reaches 4 $V_{BE}$, current $I_a$ is conducted through the first resistor $R_1$, the three diodes $D_1$ through $D_3$, and the base $B_1$ and the emitter $E_1$ of the first transistor $T_1$. Thus, the transistor $T_1$ is supplied with a base current, so that the transistor $T_1$ is turned on. As a result, a current is conducted through the third resistor $R_3$, the emitter $E_2$ and the base $B_2$ of the second transistor $T_2$, and the collector $C_1$ and the emitter $E_1$ of the first transistor $T_1$. Thus, the transistor $T_2$ is supplied with a base current so that the transistor $T_2$ is turned on. Consequently, both of the transistors $T_1$ and $T_2$ are turned on. Once both of the transistors $T_1$ and $T_2$ are turned on, the on state of the P-N-P-N switching element, comprised of the two transistors $T_1$ and $T_2$, is maintained even when the voltage at the base $B_1$ of the transistor $T_1$, or, in other words, the gate of the P-N-P-N switching element, is decreased to a value lower than the base-emitter voltage $V_{BE}$. That is, the P-N-P-N switching means is kept in the on state until the power supply voltage $V_{CC}$ is decreased to a level nearly equal to $V_{BE}$, so that the voltage between the base and the emitter of the transistor $T_1$ or $T_2$ becomes lower than $V_{BE}$. In the on state of the P-N-P-N switching means, i.e., when the transistors $T_1$ and $T_2$ are turned on, the voltage of the emitter $E_2$ of the transistor $T_2$ connected to the base $B_3$ of the third transistor $T_3$ is reduced to a low level. As a result, the transistor $T_3$ is not supplied with a base current, so that the transistor $T_3$ is turned off. Then, the fourth transistor $T_4$ is turned off. Thus, the voltage of the output terminal $V_O$ is increased to the voltage of the power line 4. Accordingly, the voltage of the output terminal $V_O$ varies along the curve indicated by arrows $F_1$, $F_2$, $F_3$, $F_4$, shown in FIG. 2, when the voltage of the power line 4 increases from zero volts to 4 $V_{BE}$ volts. A reset signal of a low level voltage is outputted from the output terminal $V_O$ during the term when the power supply voltage $V_{CC}$ increases from 2 $V_{BE}$ to 4 $V_{BE}$. Once the latching circuit 2 is turned on, the output terminal voltage $V_O$ rises, so that the output terminal does not provide the reset signal. The on state of the latching circuit 2 is kept even when the power supply voltage $V_{CC}$ decreases to a level lower than 2 $V_{BE}$. Therefore, when the power supply voltage $V_{CC}$ decreases from a constant value of, for example, 5 V to 2 $V_{BE}$, the voltage of the output terminal $V_O$ also decreases from 5 V to 2 $V_{BE}$, as indicated by arrows $F_5$ and $F_6$ in FIG. 2. Thus, once the reset signal is turned off, the reset signal is not provided even when the power supply $V_{CC}$ is turned off or the voltage of the power supply $V_{CC}$ decreases due to fluctuation or other causes. An advantage of not providing the reset signal, even when the power supply voltage decreases from 5 V to 2 $V_{BE}$, is that the flip-flop 10 can be safe from erroneous operation even when the power supply voltage fluctuates. More precisely, the flip-flop 10 is usually operated at the power supply voltage of about 5 V, but can also be operated at a decreased voltage of about 3 V. According to the embodiment, a reset signal is not provided when the power supply voltage decreases from 5 V to 3 V. Therefore, the flip-flop 10 is not reset, even when the power supply voltage decreases from 5 V to 3 V.

Figure 3:
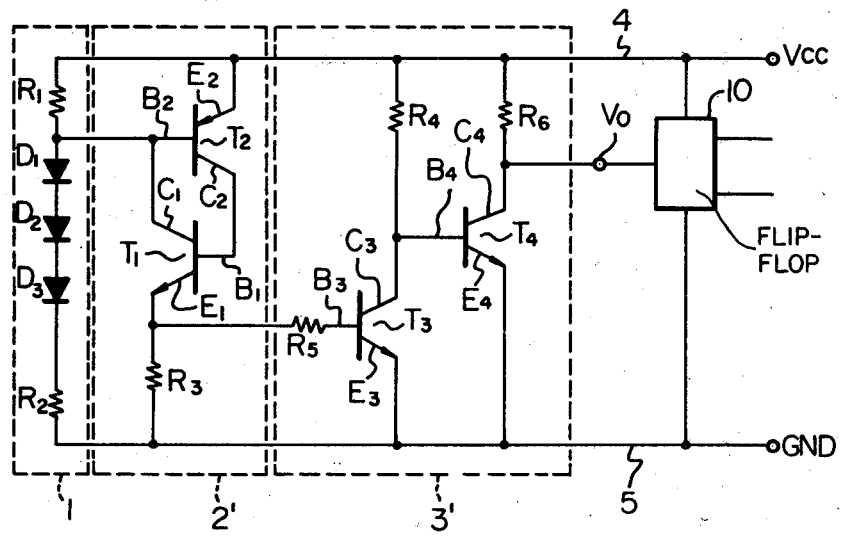
FIG. 3 is a circuit diagram of an automatic reset circuit, according to another embodiment of the invention.

FIG. 3 illustrates another embodiment of an automatic reset circuit. In FIG. 3, the automatic reset circuit also comprises a detecting circuit 1, a latching circuit 2' and a reset signal output circuit 3', as in the circuit of FIG. 1. The detecting circuit 1 is the same as that of FIG. 1, except that the value of the second resistor $R_2$ is much smaller than that of the first resistor $R_1$. The latching circuit 2' also comprises an P-N-P-N switching means, as in the circuit 2 of FIG. 1. However, in contrast to FIG. 1, a base $B_2$ of a transistor $T_2$ is connected to a point between the first resistor $R_1$ and the first diode $D_1$, an emitter $E_2$ of the transistor $T_2$ is connected directly to the power line 4, a collector $C_2$ of the transistor $T_2$ is connected to a base $B_1$ of a transistor $T_1$, a collector $C_1$ of the transistor $T_1$ is connected to the base $B_2$ of the transistor $T_2$, and an emitter $E_1$ of the transistor $T_1$ is connected through the resistor $R_3$ to the ground.

The reset signal output circuit 3' also comprises a transistor $T_3$ and a transistor $T_4$, as in the circuit 3 of FIG. 1. In contrast to FIG. 1, the base $B_3$ of the transistor $T_3$ is connected through a resistor $R_5$ to the emitter $E_1$ of the transistor $T_1$, the emitter $E_3$ is directly connected to the ground line 5, and the collector $C_3$ is connected to the base $B_4$ of the transistor $T_4$.

The operation of the circuit of FIG. 3 will now be explained with reference to both FIGS. 3 and 4. When the power line voltage increases from zero volts to $V_{BE}$, the transistor $T_4$ is turned on so that the voltage of the output terminal $V_O$ falls to a low level. When the power supply voltage reaches 4 $V_{BE}$, the transistor $T_2$ is supplied with a base current, so that the transistor $T_2$ is turned on and the P-N-P-N switching means is kept in an on state. Then the transistor $T_3$ is supplied with a base current and turned on. Thus, the voltage at the base $B_4$ is lowered, so that the transistor $T_4$ is turned off. Once the power supply voltage goes over the value of 4 $V_{BE}$, the voltage of the output terminal $V_O$ varies along with the variation of the power supply voltage $V_{CC}$.

When the power supply voltage decreases from the normal operating voltage of about 5 volts to zero volts, the circuit of FIG. 3 will operate as follows. The on state of the P-N-P-N switching element is held even when the power supply voltage $V_{CC}$ drops to a predetermined level lower than the value of 4 $B_{BE}$. When the power supply voltage $V_{CC}$ decreases to a level lower than the minimum value for holding the on state of the P-N-P-N switching element or, in other words, to a level lower than the holding voltage $V_H$ of the P-N-P-N switching element (that is, the sum of the base-emitter voltage $V_{BE}$ of the transistor $T_2$ and the collector-emitter saturation voltage $V_{CESAT}$ of the transistor $T_1$), the P-N-P-N switching element is turned off to decrease the base voltage of the transistor $T_3$ so that the transistor $T_3$ is turned off. Thus, the transistor $T_4$ is turned on and the output voltage $V_O$ is reduced to the low level, for as long as the power supply voltage $V_{CC}$ is lower than the holding voltage $V_H$ and higher than the base-emitter voltage $V_{BE}$ of the transistor $T_4$. When the power supply voltage $V_{CC}$ decreases lower than the voltage $V_{BE}$, the transistor $T_4$ is turned off and the output voltage $V_O$ is raised to the voltage $V_{CC}$.

Figure 4:
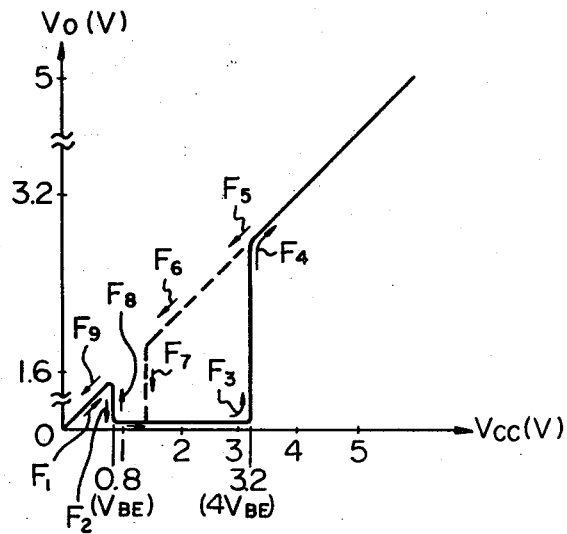
FIG. 4 is a graph diagram for explaining the operation of the circuit of FIG. 3.

In FIG. 4, the variation of the output voltage $V_O$ with respect to the variation of the power supply voltage $V_{CC}$ is illustrated. When the power supply voltage $V_{CC}$ rises from zero volts to a normal operating voltage, the output voltage varies along the curve indicated by the arrows $F_1$, $F_2$, $F_3$ and $F_4$. When the power supply voltage $V_{CC}$ falls from the normal operating voltage to zero volts, the output voltage varies along the curve indicated by the arrows $F_5$, $F_6$, $F_7$, $F_8$, and $F_9$.

In this second embodiment, the output voltage $V_O$ is turned to the low level while the power supply voltage decreases from the holding voltage $V_H$ to the base-emitter voltage $V_{BE}$, and thus a reset signal is generated at the output terminal $V_O$. However, since the collector-emitter saturation voltage $V_{CESAT}$ of the transistor $T_1$ is very small, the holding voltage $V_H$ is nearly equal to the base-emitter voltage $V_{BE}$. At the low voltage $V_H$, the flip-flop 10 connected to the output terminal $V_O$ cannot be operated. Therefore, the reset signal outputted when the power supply voltage is between the voltage $V_H$ and the voltage $V_{BE}$ does not act as a reset signal for the flip-flop 10.

Figure 5:
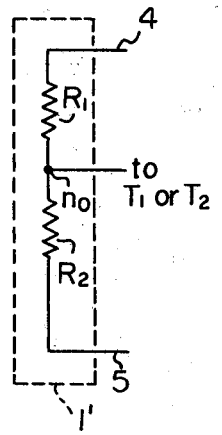
FIG. 5 is a circuit diagram of a level detecting means in an automatic reset circuit, according to still another embodiment of the invention.

As an alternate to the level detecting circuit 1 in the circuit of FIG. 1 or FIG. 3, another level detecting circuit 1' as illustrated in FIG. 5 may be employed. In FIG. 5, the level detecting circuit 1' comprises only two resistors $R_1$ and $R_2$ connected in series between the power line 4 and the ground line 5. The point $n_0$ between the resistor $R_1$ and $R_2$ is connected to the base of the transistor $T_1$ or $T_2$ in the latching circuit 2 or 2' (not shown in FIG. 5).

When the level detecting circuit 1' of FIG. 5 is adapted to the automatic reset circuit of FIG. 1, the relation between a voltage $V_T$, corresponding to the voltage 4 $V_{BE}$ as shown in FIG. 2, at which the reset signal is turned off, and the values of the resistors $R_1$ and $R_2$ is determined by the formula:

$$V_T = \frac{R_1 + R_2}{R_2} V_{BE}(T_1)$$

Also, when the level detecting circuit 1' of FIG. 5 is adapted to the automatic reset circuit of FIG. 3, the relation between the voltage $V_T$ and the resistors $R_1$ and $R_2$ is determined by the formula:

$$V_T = \frac{R_1 + R_2}{R_1} V_{BE}(T_2)$$

Accordingly, by selecting the values of the resistors $R_1$ and $R_2$, any voltage $V_T$ at which the reset signal is turned off can be determined. Thus, it is to be understood that the level detection circuits 1 of FIGS. 1, 3, and 5 function effectively as potential divider networks which permit variable selection of the desired voltage $V_T$ for determining the second predetermined level of the increasing power supply voltage value at which turn-off of the reset signal, i.e., termination thereof, is to occur.

Figure 6:
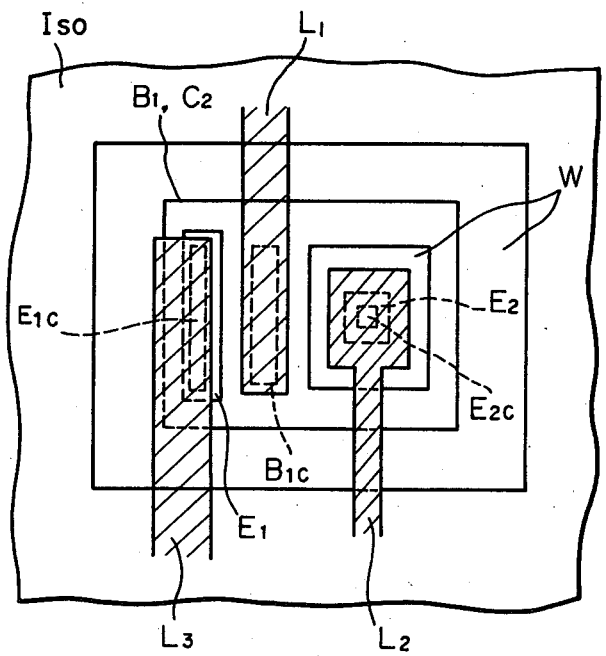
FIG. 6 is a plan view of the structure of a P-N-P-N switching element included in the circuit of FIG. 1.
Figure 7:
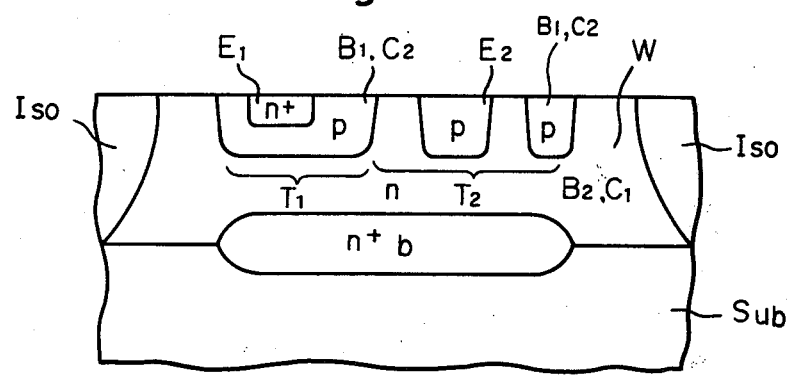
FIG. 7 is a cross-sectional view of the structure of the P-N-P-N switching element included in the circuit of FIG. 1.

FIGS. 6 and 7 respectively illustrate a plan view and a cross-sectional view of the structure of the P-N-P-N switching element included in the circuit of FIG. 1. In FIGS. 6 and 7, Sub represents the substrate of the integrated circuit on which the P-N-P-N switching element is loaded. The notation n+b represents an n+-type buried layer, W represents an epitaxial layer, and Iso represents an isolation layer for the epitaxial layer W. A lead $L_1$ is connected to a base contact portion $B_{1C}$ of the base $B_1$. A lead $L_2$ is connected to an emitter contact portion $E_{2C}$ of the emitter $E_2$. A lead $L_3$ is connected to an emitter contact portion $E_{1C}$ of the emitter $E_1$. As illustrated in FIG. 7, the transistor $T_1$ is formed as a vertical transistor and the transistor $T_2$ is formed as a lateral transistor. By such an arrangement, the base $B_1$ of the transistor $T_1$ and the collector $C_2$ of the transistor $T_2$ can be formed on the same area. Also, the base $B_2$ and the collector $C_1$ can be formed together in an area different from the area on which $B_1$ and $C_2$ are formed. Therefore, the P-N-P-N switching element having common regions of a collector and a base can be made by conventional steps and can easily be assembled in an integrated circuit.

In the foregoing embodiments, although the flip-flop 10 can be reset by receiving a low level voltage to its reset input, a flip-flop which can be reset by receiving a high level voltage at its input may also be used. In this case, the reset signal at the reset output terminal $V_O$ must be inverted and then applied to the flip-flop.

Also, in the foregoing embodiments, although only one flip-flop is connected to the output terminal $V_O$ of the automatic reset circuit, alternatively, a number of circuit elements which are required to be reset when power is turned on can be connected in practice.

Further, three diodes $D_1$, $D_2$, and $D_3$ are used and the voltage drop across one diode in the forward direction is about $V_{BE}$ in the level detecting circuit of FIG. 1 or 3; however, the present invention is not restricted to that. Alternatively, a larger or smaller number of diodes may be used, and the voltage drop across each diode may be larger or smaller than $V_{BE}$. By changing the number of diodes, or the voltage drop across each diode, or the ratio of the value of the first resistor $R_1$ to that of the second resistor $R_2$, the voltage $4 V_{BE}$, which was the value when the reset signal is stopped, can be changed.

From the foregoing description of the preferred embodiments, it will be understood that, according to the present invention, an automatic reset circuit can be obtained which is easily assembled in an integrated circuit without increasing the number of pins, because no special pin for receiving a reset signal is required and a reset signal is automatically applied to the circuit element required to be reset when power is turned on. In addition, once the power supply voltage is raised to the operating voltage so that the reset signal is turned off, the reset signal is not produced even when the power supply voltage fluctuates. Therefore, these circuit elements are protected from erroneous operation. Thus, a test or analysis of troubles of, for example, flip-flops in a counter, can easily be performed without requiring any external pin for receiving a reset signal. Further, the circuit of the present invention can easily be integrated into a chip by conventional manufacturing processes.

What is claimed is:

1. A circuit having an output terminal for automatically generating a reset signal at said output terminal during, and in response to, the increase in value of a power supply voltage from an initial turn-on value to a predetermined normal operating value thereof, comprising:
    means for receiving a power supply voltage, said power supply voltage increasing from an initial value at turn-on to a predetermined, normal operating value,
    first means connected to said power supply voltage receiving means for detecting the increase in value of the power supply voltage to a first predetermined level and for clamping the voltage at said output terminal to a low potential level so as to generate a reset signal in response to the power supply voltage value reaching the first predetermined level,
    second means connected to said power supply voltage receiving means for detecting the increase in value of said power supply voltage to a second predetermined level greater than said first predetermined level and lower than said normal operating value, and for generating a level detection signal in response to the power supply voltage value increasing to said second predetermined level; and
    latching means having first and second states and responsive to the level detection signal output of said second means for switching from said first to said second state thereof, and said latching means being connected to said first means and operative when switched to said second state thereof for releasing said first means from clamping the voltage at said output terminal so as to disable said first means from generating a reset signal, said latching means remaining in said second state thereof regardless of said power supply voltage decreasing to a value less than said second predetermined level.

2. A circuit as recited in claim 1, wherein said latching means comprises a P-N-P-N switching element.

3. A circuit as recited in claim 1, or 2, wherein said second means comprises at least one diode.

4. A circuit as recited in claim 1, or 2, wherein said second means comprises two resistors connected in series, and said level detection signal output thereof is produced at the series connection point of said resistors.

5. In an integrated circuit having external voltage supply, ground, and signal terminals thereon associated with at least one circuit element contained in said integrated circuit, an automatic reset circuit contained internally in said integrated circuit for generating a reset signal for supply, from an output terminal of said reset circuit internally of said integrated circuit, to said at least one circuit element in response to an increase in the level of a power supply voltage supplied to said external power supply voltage terminal from an initial value at turn-on to a predetermined, normal operating value thereof, said reset circuit comprising:
    means for connecting said reset circuit to said external power supply voltage terminal and said external ground terminal for applying said power supply voltage to said reset circuit,
    first means connected to said power supply voltage applying means for detecting the increase in value of the power supply voltage to a first predetermined level and for clamping the voltage at said output terminal to a low potential level so as to generate a reset signal in response to the power supply voltage value reaching the first predetermined level,
    second means connected to said power supply voltage receiving means for detecting the increase in value of said power supply voltage to a second predetermined level greater than said first predetermined level and lower than said normal operating value, and for generating a level detection signal in response to the power supply voltage value increasing to said second predetermined level; and
    latching means having first and second states and responsive to the level detection signal output of said second means for switching from said first to said second state thereof, and said latching means being connected to said first means and operative when switched to said second state thereof for releasing said first means from clamping the voltage at said output terminal so as to disable said first means from generating a reset signal, said latching means remaining in said second state thereof regardless of said power supply voltage decreasing to a value less than said second predetermined level.

6. A circuit as recited in claim 1 or 5, wherein:
    said first means comprises at least a first transistor connected in series with a resistor between said power supply voltage receiving means and ground, the series connection of said resistor and said transistor defining an output terminal of said first means at which said reset signal is produced by said first means,
    said latching means comprises a P-N-P-N switching element connected in series with a resistor between said power supply voltage receiving means and ground, the series connection point of said resistor and said P-N-P-N switching element comprising an output terminal of said latching means and having first and second voltage values corresponding to said first and second states of said P-N-P-N switching element, respectively, said output terminal of said latching means being connected to said first means, and said second voltage value thereof in said second state of said latching means disabling said first means from generating a reset signal when said supply voltage decreases below said second predetermined value.

7. A circuit as recited in claim 6, wherein said second means comprises a potential divider network connected between said power supply voltage receiving means and ground and includes an output terminal connected to the gate of said P-N-P-N switching element, said second means producing said level detection signal when said power supply voltage increases to said second predetermined level and said P-N-P-N switching element of said latching means responding to said level detection signal to switch to said second state thereof, thereby to disable said first means, and said P-N-P-N switching element remaining in said second state when said supply voltage value decreases below said second predetermined level.

8. A circuit as recited in claim 7, wherein said potential divider network of said second means comprises at least one diode.

9. A circuit as recited in claim 1 wherein:
said first means comprises first and second transistors respectively connected in series through corresponding first and second resistors to said power supply voltage receiving means with said respective resistors connected to said power supply voltage receiving means and the emitters of said first and second transistors respectively connected to ground and with the collector of said first transistor connected to the base of said second transistor,
said latching means comprises a P-N-P-N switching element connected in series with a resistor between said power supply voltage receiving means and ground with a first P region of said switching element connected to said power supply voltage receiving means and with a second N region of said switching element connected to a first terminal of said resistor at the series connection thereof and with a second terminal of said resistor connected to ground, the first N region of said switching element comprising a gate thereof and being connected to said second means to receive said level detection signal therefrom, for rendering said switching element conductive when said power supply voltage increases above said second predetermined level,
said second transistor of said first means responding to said power supply voltage value increasing to said first predetermined level to be rendered conductive thereby and produce said reset output signal at said reset terminal thereof,
said first transistor of said first means responding to said P-N-P-N switching element switching to said second, conductive state thereof in response to said power supply voltage exceeding said second detection level thereby to be rendered conductive and correspondingly to render said second transistor of said first means nonconductive thereby to terminate generation of said reset signal, and
said P-N-P-N switching element remaining in said second, conductive state as said power supply voltage level decreases below said second predetermined level thereby to maintain said first transistor of said first means conductive and to disable said first means from generating said reset signal when said power supply voltage value decreases below said second predetermined level.

10. A circuit as recited in claims 1, 9, or 5 wherein said second means comprises two resistors connected in series, and said level detection signal generated by said second means is produced at the series connection point of said resistors.

11. A circuit as recited in claim 1 or 9 wherein:
said first means comprises first and second transistors respectively connected in series with corresponding first and second resistors between said power supply voltage receiving means and ground, with said resistors connected to said power supply voltage receiving means, and with the emitter terminals of said transistors connected to ground and the emitter of said second transistor connected to the base of said first transistor, the series connection of said second transistor and said second resistor comprising an output terminal of said first means at which said reset signal is produced,
said latching means comprises a series connection of a resistor and a P-N-P-N switching element, said resistor being connected at a first terminal thereof to said power supply voltage receiving means and at a second terminal thereof to a first P region of said switching element at the series connection thereof, and said second N region of said switching element being connected to ground,
the base terminal of said first transistor of said first means being connected to the series connection of said resistor and said P-N-P-N switching element of said latching means, and said first transistor being rendered conductive as said power supply voltage increases above said first predetermined level, thereby to render said second transistor conductive for generating said reset signal at said output terminal of said first means, and
said P-N-P-N switching element of said latching means being rendered conductive in response to said level detection signal of said second means and thereby disabling conduction of said first transistor of said first means, correspondingly rendering said second transistor of said first means nonconductive for terminating said reset signal and said P-N-P-N switching element remaining in said second, conductive state when said power supply voltage value falls below said second predetermined level, thereby to maintain said first and second transistors of said first means nonconductive and disabled from generating said reset signal when said power supply voltage falls below said second predetermined level.

12. A circuit as recited in claim 9, wherein said second means comprises a potential divider network connected between said power supply voltage receiving means and ground and incudes an output terminal connected to the gate of said P-N-P-N switching element, said second means producing said level detection signal when said power supply voltage increases to said second predetermined level and said P-N-P-N switching element of said latching means responding to said level detection signal to switch to said second state thereof, thereby to disable said first means, and said P-N-P-N switching element remaining in said second state when said supply voltage value decreases below said second predetermined level.

* * * * *